(12) United States Patent
Björkengren et al.

(10) Patent No.: US 6,493,056 B2
(45) Date of Patent: Dec. 10, 2002

(54) INTERPOSER DEVICE

(75) Inventors: Ulf Björkengren, Bjärred (SE); Torbjörn Gärdenfors, Malmö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 49 days.

(21) Appl. No.: 09/732,818

(22) Filed: Dec. 8, 2000

(65) Prior Publication Data

US 2001/0015785 A1 Aug. 23, 2001

(30) Foreign Application Priority Data

Dec. 10, 1999 (SE) .............................. 9904516

(51) Int. Cl.$^7$ .............................. G02F 1/1335
(52) U.S. Cl. ..................................... 349/151
(58) Field of Search .......................... 349/151

(56) References Cited

U.S. PATENT DOCUMENTS

| | | | | |
|---|---|---|---|---|
| 5,117,300 A | * | 5/1992 | Wiemer ....................... 349/151 |
| 5,467,210 A | | 11/1995 | Kishigami ................... 359/88 |
| 5,777,391 A | | 7/1998 | Nakamura et al. ........... 257/778 |
| 5,893,623 A | * | 4/1999 | Muramatsu .................. 349/151 |
| 5,982,468 A | * | 11/1999 | Satou et al. ................. 349/151 |
| 6,005,652 A | * | 12/1999 | Matsuhira .................... 349/151 |
| 6,300,997 B1 | * | 10/2001 | Saito et al. .................. 349/151 |

FOREIGN PATENT DOCUMENTS

| | | |
|---|---|---|
| EP | 0 587 144 A2 | 9/1993 |
| EP | 0 735 404 A1 | 9/1995 |
| EP | 0 794 451 A1 | 3/1997 |
| GB | 2 151 834 A | 12/1984 |
| JP | 62136063 | 11/1987 |

* cited by examiner

Primary Examiner—James Dudek
(74) Attorney, Agent, or Firm—Jenkens & Gilchrist, P.C.

(57) ABSTRACT

A liquid-crystal display (LCD) comprises an LCD device, including a substrate (107) with substrate pads (106) on the top surface of the substrate (107) and a chip (105) with chip electrodes (104) operatively connected to said substrate pads (106). Additionally, an interposer device (100) is mounted between the chip (105) and the substrate (107), wherein the interposer device (100) inter-connects the substrate pads (106) configured in a first pattern with the electrodes (104) configured in an arbitrary second pattern on the chip area, wherein the electrodes (104) have a reduced electrode pitch essentially smaller than said pad pitch.

19 Claims, 2 Drawing Sheets

INTERPOSER DEVICE

FIELD OF THE INVENTION

The present invention relates to an arrangement of mounting a chip on a substrate, and more particularly to an interposer device for use in an arrangement of mounting a chip on a substrate for operatively connecting chip electrodes with substrate pads in a liquid-crystal display (LCD).

DESCRIPTION OF THE PRIOR ART

Liquid-crystal display (LCD) technology is commonly used in mobile telephone portable PCs and other portable electronic devices. Increasing demands for displays providing even higher reformation content. e.g greyscale functionality, larger number of pixels, etc, result in an increased silicon area of the LCD driver chip, However, the area of the driver chip already constitutes a significant part of the total silicon area in for example state of the art mobile phones.

A Chip on Glass (COG) LCD is an LCD having a semiconductor or an LCD driver chip mounted directly on an LCD substrate, preferably a glass substrate. COG has become commonly used due to its relatively low cost and that the mounting method is space efficient and provides a compact solution. However, conventional COG has a disadvantage. The pad layouts of an LCD driver used in the conventional COG implementation have to meet certain restrictions. The restrictions are mainly due to the layouts rules that the conductive line pattern on the LCD substrate has to follow.

U.S. Pat. No. 5,467,210 discloses an arrangement of bonding an IC chip to an LCD device. The IC chip is a "bare IC chip" in which a single surface of a semiconductor bulk has multiple semiconductor devices fabricated thereon and a passivation film covers the semiconductor devices fabricated side, so that only terminals for connection to a device outside the chip are uncovered. The bare IC chip lacks a lead frame to which the bare IC chip is bonded, leads, bonding wires connecting the terminals of the bare IC chip to the leads, and a package of ceramic etc.

A prior art solution of a Chip On Glass LCD device according to U.S. Pat. No. 5,467,210 or the like is illustrated in FIGS. 1 and 2. According to FIG. 1, electrodes 1 are provided on a single line along the circumference of a driver chip 2, which is the only possible pattern for the electrodes. Segment output electrodes are provided along one side 3, and row output electrodes are split up in two halves on each side 4 and 4' of the segment output electrodes 3. Further, the logic supply input electrodes and the I/O interface electrodes are placed on the opposite side 5 of the chip to the segment output electrodes 3, The chip 2 is mounted on a lower glass substrate 6 in the form of a rectangular board by a bonding method. In the bonding method employed in U.S. Pat. No. 5,467,210, the chip includes bumps swelling from the electrodes. An anisotropic electrically conductive adhesive is applied to substrate pads 7 on the substrate 6. The anisotropic electrically conductive adhesive comprises an adhesive medium and electrically conductive particles dispersed in the adhesive medium so as to separate from each other. The anisotropic electrically conductive adhesive possesses an electrical conductivity only along the thickness thereof. The chip 2 is bonded to the pads 7 of the lower glass substrate 6 so that the bumps of the electrodes 1 are bonded to the pads 7.

A top view of an LCD device comprising the chip 2 mounted on the lower glass substrate 6 as described above is shown in FIG. 2. Further, an upper glass substrate 8 in the form of a rectangular board is mounted on the larger lower glass substrate 6, and a rectangular area 9 including a grid constitutes a display area in which data lines and scanning lines cross in the form of a matrix.

An obvious solution in order to limit the increase of the silicon area and/or reduce the total silicon area of the driver chip 2 would be to use silicon processes with finer line widths.

Today, a minimum pad pitch of about 50–100 $\mu$m can be used on the substrate whilst maintaining an acceptable yield loss from the driver mounting process. An LCD driver chip has several hundred electrodes for connection to the pads of the glass substrate, which sets a minimum silicon area of the chip. If the silicon area needed for the implementation of the functionality of the driver is less than the area set by the circumference on the chip needed to lay out the pads with the associated pad pitch, the driver is pad-limited. A further reduction of the chip area needed for the functionality by using silicon processes with finer line widths will, however, not lead to a smaller total chip area. Increasing demands for displays providing even higher information content result in driver chips with an increased number of pads and, consequently, a larger chip size. As described above, the driver chip will be pad-limited and the total chip area will not decrease even if smaller line widths are used.

SUMMARY OF THE INVENTION

It is therefore an object of the present invention to provide an improved arrangement of mounting an IC chip on a substrate in order to reduce the problem of pad limitation.

This object is accomplished by an interposer device according to the invention for use in the arrangement of mounting the IC chip on a substrate. interposer electrodes are mounted on said interposer device according to a first pattern corresponding to a configuration of chip electrodes on the IC chip with a reduced electrode pitch. Further, interposer pads are mounted on said interposer device according to a second pattern corresponding to a configuration of substrate pads with a particular pad pitch on the substrate. In order to operatively connecting the chip electrodes with the corresponding substrate pads, the interposer pads are interconnected with interposer electrodes via interconnecting leads printed on the interposer.

Another object of the invention is to provide an improved liquid-crystal display (LCD) with a reduced silicon area on the LCD driver, whereby the disadvantages caused by substrate pad-limitation are reduced.

This object is accomplished by a liquid-crystal display (LCD) according to the invention, including an interposer device mounted between the IC chip and the substrate, wherein said interposer device operatively interconnects substrate pads configured in a first pattern on the substrate with electrodes configured in a second pattern on the driver chip, wherein said electrodes have a reduced electrode pitch essentially smaller than the pad pitch of the substrate pads.

Still another object of the invention is to provide an improved method of mounting an IC chip on a substrate in order to reduce the problem of pad limitation.

This object of the invention is accomplished by a method according to the invention, wherein the chip is bonded to an interposer device, and then the interposer device is bonded to the substrate, wherein the interposer device interconnects substrate pads configured in a first pattern on the substrate with electrodes configured in a second pattern, wherein said electrodes have a reduced electrode pitch essentially smaller than the pad pitch of the substrate pads.

An advantage of the LCD according to the invention is that a total cost reduction is achieved, because the cost per areas of the interposer means is lesser than the cost per area of the chip.

BRIEF DESCRIPTION OF THE DRAWINGS

In order to explain the invention in more detail and the advantages and features of the invention a preferred embodiment will be described in detail below, reference being made to the accompanying drawings, in which.

DETAILED DESCRIPTION OF THE INVENTION

Figure 1:
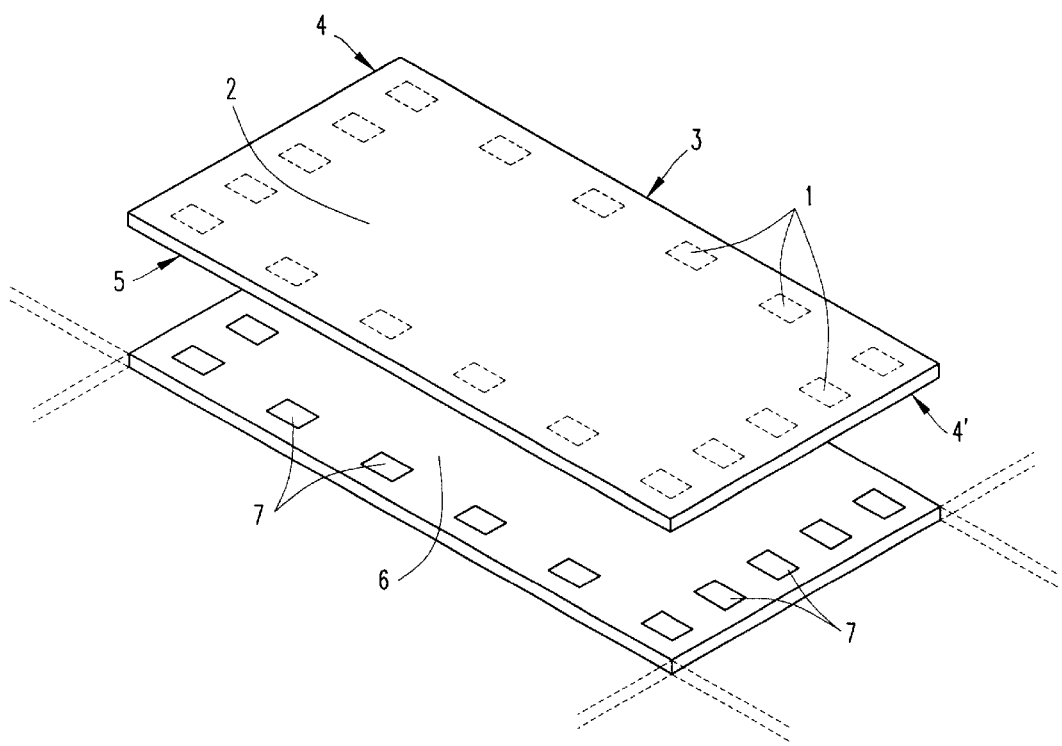
FIG. 1 is a perspective view of a glass substrate and a corresponding driver chip before bonding to the substrate according to a prior art method.
Figure 2:
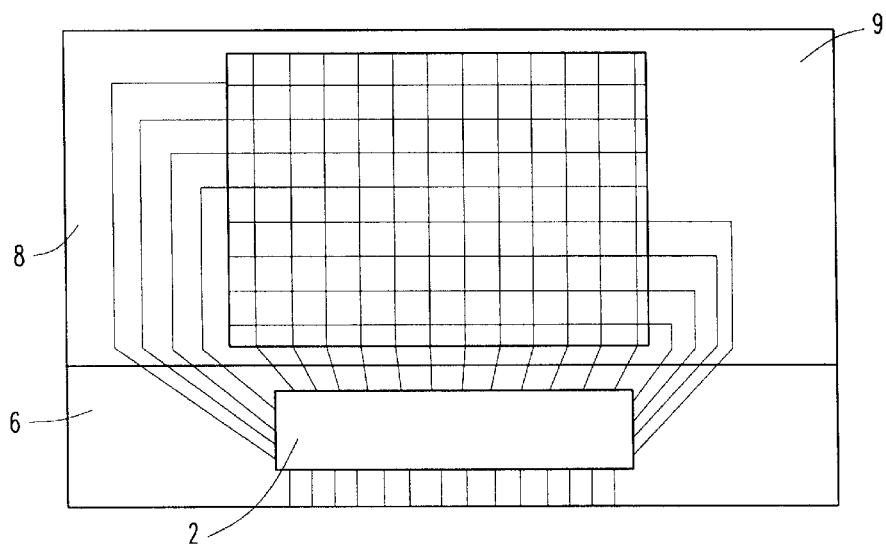
FIG. 2 is plan view of a prior art LCD display, comprising the chip and the glass substrate in FIG. 1 after the bonding.
Figure 3:
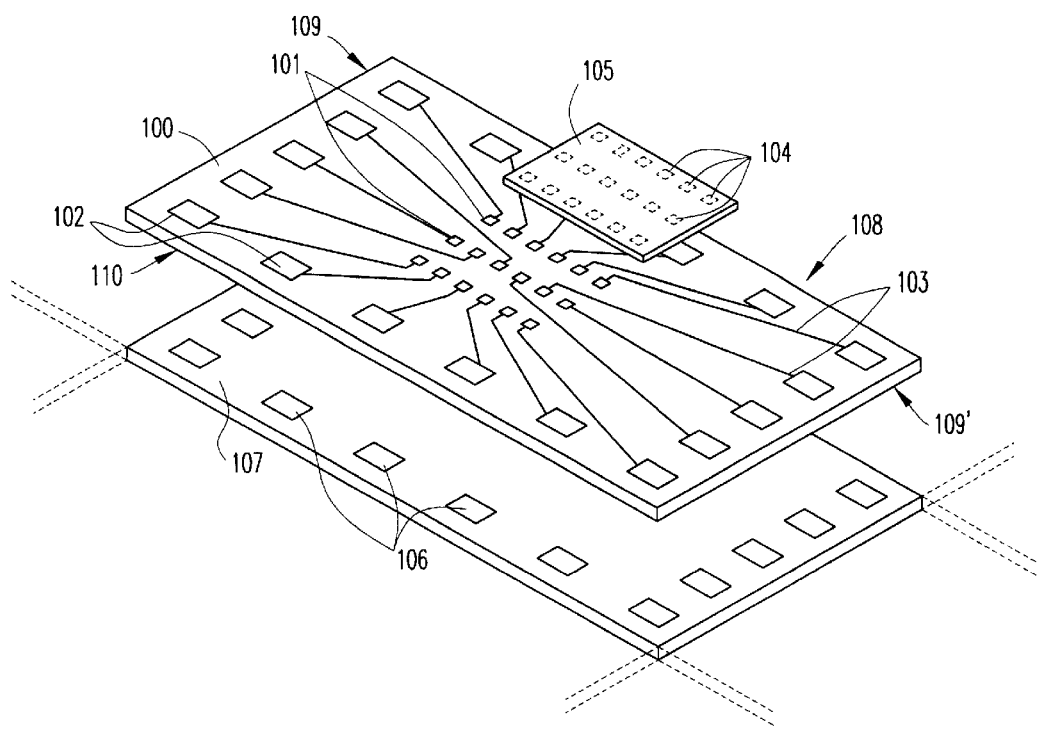
FIG. 3 is a perspective view of a glass substrate, a driver chip, and an intermediate interposer device according to the present invention before the bonding.

An embodiment of an interposer device according to the invention for use in an arrangement of mounting an IC chip oh a substrate is shown in FIG. 3.

The interposer device 100 has interposer electrodes 101 or pads, mounted on the interposer device in a first pattern, and interposer pads 102, mounted on the interposer device 100 in a second pattern. In this embodiment the interposer pads 102 are designed as metallized holes through the interposer substrate for interconnecting with said interposer electrodes 101 by means of printed electronically conductive leads 103 provided on the same side of the interposer as the interposer electrodes 101. In an alternative embodiment of the interposer the interposer electrodes 101 are designed as metallized holes through the interposer substrate for interconnecting with said interposer pads 102 by means of the printed electronically conductive leads 103 provided on the same side of the interposer as the interposer pads 102. The interposer device 100 is a metallized polyamide substrate or flex film in the embodiment. The electrodes 101, pads 102 and the leads 103 are made of copper or gold/nickel plated copper in the embodiment. However, other electronically conductive materials can be used in alternative embodiments of the invention.

The first pattern corresponds to a configuration of chip electrodes 104 mounted on an IC chip 105 with a reduced electrode pitch, and the second pattern corresponds to a configuration of substrate pads 106 mounted on a substrate 107, a glass substrate in the embodiment, with a particular pad pitch.

In this embodiment, the interposer electrodes 101 as well as the chip electrodes 104 are configured in a grid pattern covering a smaller area than the interposer pads 102 configured according to the second pattern. The grid pattern is only an exemplification of a suitable pattern, but, of course, the chip electrodes 104 can be arranged in another pattern in an alternative embodiment of the invention. A preferred pattern is still the circumference pattern, in which the electrodes are provided on a single line along the circumference of the driver chip. However, there are several other possible patterns, which can be used within the scope of the invention.

As shown in FIG. 3, the interposer pads 102 are provided on a single line along the circumference of the interposer 100. Segment output pads are provided along one side 108, and row output electrodes are split up in two halves on each side 109 and 109'. Further, the logic supply input pads and the I/O interface pads are placed on the opposite side 110 of the interposer to the segment output pads.

Figure 4:
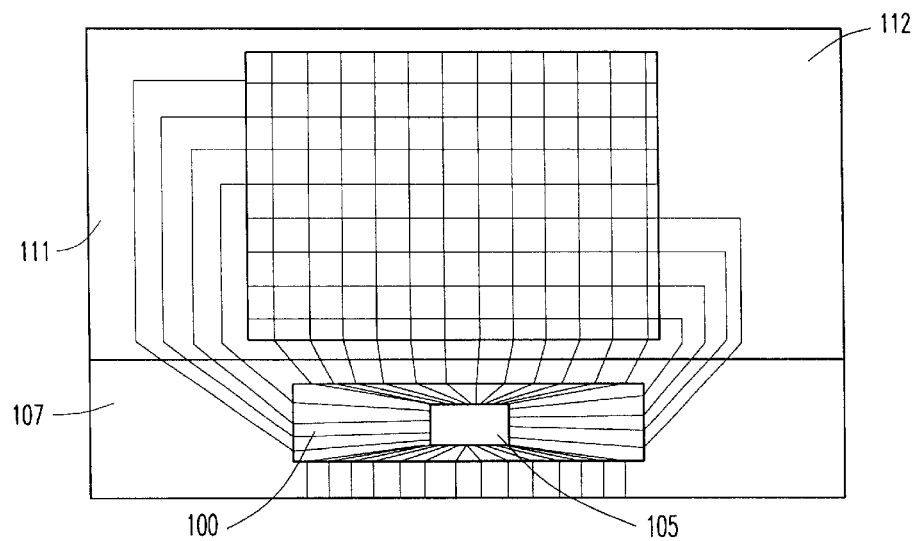
FIG. 4 is plan view of an LCD display according to the invention, comprising the chip, the glass substrate, and the intermediate interposer in FIG. 3 after bonding.

With reference to FIG. 4, the chip 105 is bonded to the interposer 100 by means of bumps swelling from the chip electrodes 104 and an anisotropic electrically-conductive adhesive or film is applied to the interposer electrodes 101 on the interposer 100. The anisotropic electrically conductive adhesive comprises an adhesive medium and electrically conductive particles dispersed in the adhesive medium so as to separate from each other. The anisotropic electrically conductive adhesive possesses an electrical conductivity only along the thickness thereof. The chip 105 is bonded to the interposer 100 so that the bumps of the chip electrodes 104 are bonded to the interposer electrodes 101.

Similarly, the interposer 100 is then bonded to the lower substrate 107 by means of bumps swelling from the interposer pads 102 or the substrate pads 106 of the substrate 107 and an intermediate anisotropic electrically-conductive adhesive is applied to the substrate pads 106 on the substrate 107.

Thus, the interposer is bonded to the substrate pads 106 of the lower glass substrate 107 so that the bumps of the interposer pads 102 are bonded to the substrate pads 106.

Consequently, the chip electrodes 104 are operatively connected to the substrate pads 106 by means of the interposer device 100.

Even though the anisotropic electrically conductive adhesive bonding method is a preferable bonding method, the mounting of the chip on the interposer and the interposer on the substrate is not limited to this particular anisotropic electrically conductive adhesive system.

An upper glass substrate 111 in the form of a rectangular board is mounted on the larger lower glass substrate 107, and a rectangular area 112 including a grid constitutes a display area in which data lines and scanning lines cross in the form of a matrix, forming a liquid-crystal display (LCD) for use in an electronic apparatus, such as a mobile telephone, pager, communicator, electronic organizer, smartphone etc.

Even though characteristics and advantages of the present invention have been set forth in the foregoing description, together with details of the structure, it is to be understood that the disclosure is illustrative only, and changes may be made in detail, especially in matters of size of the chip and the pad layouts, i.e the electrode pattern on the chip and the corresponding electrodes on the interposer means, within the principles of the invention indicated by the broad general meaning of the claims.

In this embodiment of the invention, the chip is rectangular. However, in another embodiment of the invention the chip can have a different shape, for example as a square, or as another kind of polygon etc.

What is claimed is:

1. A liquid-crystal display (LCD) comprising:
    an LCD device comprising:
        a substrate with substrate pads on a top surface of said substrate, said substrate pads being configured in a first pattern; and
        a chip with chip electrodes, said chip electrodes being configured in a second pattern, said second pattern being other than a circumference pattern; and
    an interposer device mounted between said chip and said substrate, wherein said interposer device operatively interconnects said substrate pads with said chip electrodes; and wherein said chip electrodes have an electrode pitch smaller than a pad pitch.

2. The liquid-crystal display (LCD) according to claim 1, wherein:
said interposer device has interposer electrodes, said interposer electrodes being mounted on said interposer device according to said first pattern;
said interposer electrodes are connected to said chip electrodes and to interposer pads, said interposer electrodes being mounted on said interposer device according to said second pattern; and
said interposer pads are connected to said substrate pads.

3. The liquid-crystal display (LCD) according to claim 1 or 2, wherein said first pattern is a circumference pattern.

4. The liquid-crystal display (LCD) according to claim 1 or 2, wherein said second pattern is a grid pattern.

5. The liquid-crystal display (LCD) according to claim 1 or claim 2, wherein said chip is bonded to said interposer device via an anisotropic adhesive system.

6. The liquid-crystal display (LCD) according to claim 5, wherein said interposer device is bonded to said substrate via an anisotropic adhesive system.

7. The liquid-crystal display (LCD) according to claim 2, wherein said interposer device is a flex film provided with electronically conductive leads interconnecting said interposer pads with said interposer electrodes.

8. The liquid-crystal display (LCD) according to claim 2, wherein said interposer pads are selected from the group consisting of:
metallized holes through an interposer substrate for interconnecting with said interposer electrodes via printed electronically conductive leads provided on said interposer device; and
metallized holes through the interposer substrate for interconnecting with said interposer pads via the printed electronically conductive leads provided on said interposer device.

9. An electronic apparatus, comprising a liquid-crystal display (LCD) according to any of claims 1–2.

10. The electronic apparatus according to claim 9, wherein said electronic apparatus is selected from the group consisting of mobile telephones, pagers, communicators, electronic organizers, and smartphones.

11. An interposer device for mounting a chip with chip electrodes on a substrate with substrate pads in a liquid-crystal display (LCD), the interposer device comprising:
interposer electrodes mounted on said interposer device according to a first pattern, said first pattern corresponding to a configuration of said chip electrodes placed across a chip area, said first pattern being other than a circumference pattern; and
interposer pads mounted on said interposer device according to a second pattern, said second pattern corresponding to a configuration of said substrate pads;
wherein said interposer pads are interconnected with said interposer electrodes; and
wherein said electrodes have an electrode pitch smaller than a pad pitch.

12. The interposer device according to claim 11, wherein said interposer device is a flex film provided with electronically conductive leads interconnecting said interposer pads with said interposer electrodes.

13. The interposer device according to claim 11, wherein said interposer pads are selected from the group consisting of:
metallized holes through an interposer substrate for interconnecting with said interposer electrodes via printed electronically conductive leads provided on the interposer device;
metallized holes through the interposer substrate for interconnecting with said interposer pads via the printed electronically conductive leads provided on said interposer device.

14. A method of mounting a chip with chip electrodes on a substrate with substrate pads in a liquid-crystal display (LCD), the method comprising the steps of:
bonding said chip to an interposer device;
bonding said interposer device to said substrate;
wherein said interposer device interconnects said substrate pads with said chip electrodes;
wherein said substrate pads are configured in a first pattern;
wherein said chip electrodes are configured in a second pattern, said second pattern being other than a circumference pattern; and
wherein said electrodes have an electrode pitch smaller than a pad pitch.

15. The method according to claim 14, wherein said chip is bonded to said interposer device via an anisotropic adhesive system.

16. The method according to claim 15, wherein said interposer device is bonded to said substrate via an anisotropic adhesive system.

17. The method of claim 14, wherein the steps are performed in the order listed.

18. The interposer device according to claim 11 or 12, wherein said first pattern is a grid pattern.

19. The method according to claim 14, wherein said second pattern is a grid pattern.

* * * * *